United States Patent [19]

Stolmeijer et al.

[11] Patent Number: 5,654,915
[45] Date of Patent: Aug. 5, 1997

[54] 6-BULK TRANSISTOR STATIC MEMORY CELL USING SPLIT WORDLINE ARCHITECTURE

[75] Inventors: André Stolmeijer, Santa Clara; Christopher Petti, Menlo Park, both of Calif.

[73] Assignee: Cypress Semiconductor Corp., Calif.

[21] Appl. No.: 663,603

[22] Filed: Jun. 14, 1996

Related U.S. Application Data

[63] Continuation of Ser. No. 311,366, Sep. 23, 1994, abandoned, which is a continuation of Ser. No. 109,094, Aug. 19, 1993, abandoned.

[51] Int. Cl.[6] .................................................. G11C 11/419
[52] U.S. Cl. ........................... 365/156; 365/51; 365/63; 365/72; 365/190; 365/208
[58] Field of Search .................................. 365/154, 156, 365/63, 72, 190, 208, 51

[56] References Cited

U.S. PATENT DOCUMENTS

| | | | |
|---|---|---|---|
| 4,710,897 | 12/1987 | Masuoka et al. | 365/154 |
| 5,040,146 | 8/1991 | Mattausch et al. | 365/190 |
| 5,048,023 | 9/1991 | Buehler et al. | 365/156 |
| 5,053,993 | 10/1991 | Miura | 365/156 |
| 5,072,286 | 12/1991 | Minami et al. | 365/156 |
| 5,172,335 | 12/1992 | Sasaki et al. | 365/51 |
| 5,274,746 | 12/1993 | Mashiko | 365/190 |
| 5,373,170 | 12/1994 | Pfiester et al. | 365/156 |
| 5,373,466 | 12/1994 | Landeta et al. | 365/154 |

OTHER PUBLICATIONS

*1993 Symposium on VLSI Technology*, May 17–19 1993/ Kyoto, pp. 65–66, M. Helm et al.
*APolysilicon Transistor Technology for Large Capacity SRAMs*, Shuji Ikeda, et al., 1990, pp. 18.1.1–18.1.4, 1990 IEDM Conf. Proc.
*A 25 um Bulk Full CMOS SRAM Cell Technology with Fully Overlapping Contacts*, R.D.J. Verhaar, et al., 1990 IEEE, pp. 18.2.1–18.2.4, 1990 IEDM Conf. Proc.
*A Split Wordline for 17Mb SRAM Using Polysilicon Sidewall Contacts*, Kazuo Itabashi, et al., 1991 IEEE, pp. 17.41.–17.4.4, 1991 IEDM Conf. Proc.

Primary Examiner—Joseph E. Clawson, Jr.
Attorney, Agent, or Firm—Blakely, Sokoloff, Taylor & Zafman, LLP

[57] ABSTRACT

The present invention relates to a solid-state bi-stable circuit functioning as a six-bulk transistor static memory cell, the circuit comprising a plurality of bitlines and at least a first and second reference line, all of which are positioned in parallel with a plurality of wordlines. The circuit further comprises a plurality of transistors including a first and second load transistor, a first and a second pull-down transistor and a first and a second access transistor, in which each of the plurality of transistors includes a gate, source and drain. The gates of the plurality of transistors are positioned in parallel to minimize area usage.

17 Claims, 7 Drawing Sheets

6-BULK TRANSISTOR STATIC MEMORY CELL USING SPLIT WORDLINE ARCHITECTURE

This is a continuation of application Ser. No. 08/311,366, filed Sep. 23, 1994, now abandoned, which is a divisional of application Ser. No. 08/109,094, filed Aug. 19, 1993, abandoned.

BACKGROUND OF THE INVENTION

1. Field of the Invention

The present invention relates to a static memory cell more particularly, the present invention relates to a solid-state bi-stable circuit functioning as a six-bulk transistor static memory cell having each gate of the six transistors positioned in parallel with each other.

2. Description of Related Art

In today's semiconductor industry, solid-state memory cells are usually fabricated by using metal-oxide-semiconductor field effect transistors ("MOSFETs"). Generally stated, static memory cells are formed by interconnecting two inverters together so that the input of a first inverter is tied to the output of a second inverter and vice versa. Such interconnections create positive feedback which allows the memory cell to store data, either an active "high" or "low" input (i.e., a logic "1" or "0"). Data is stored in these memory cells during a "write cycle" and that data is subsequently read during a "read" cycle. Static memory is typically used in computers such as desk and lap top personal computers, as well as many other industrial applications. As computer technology strives toward smaller and more powerful computer systems, the need for smaller and more stable memory devices increases.

Figure 1:
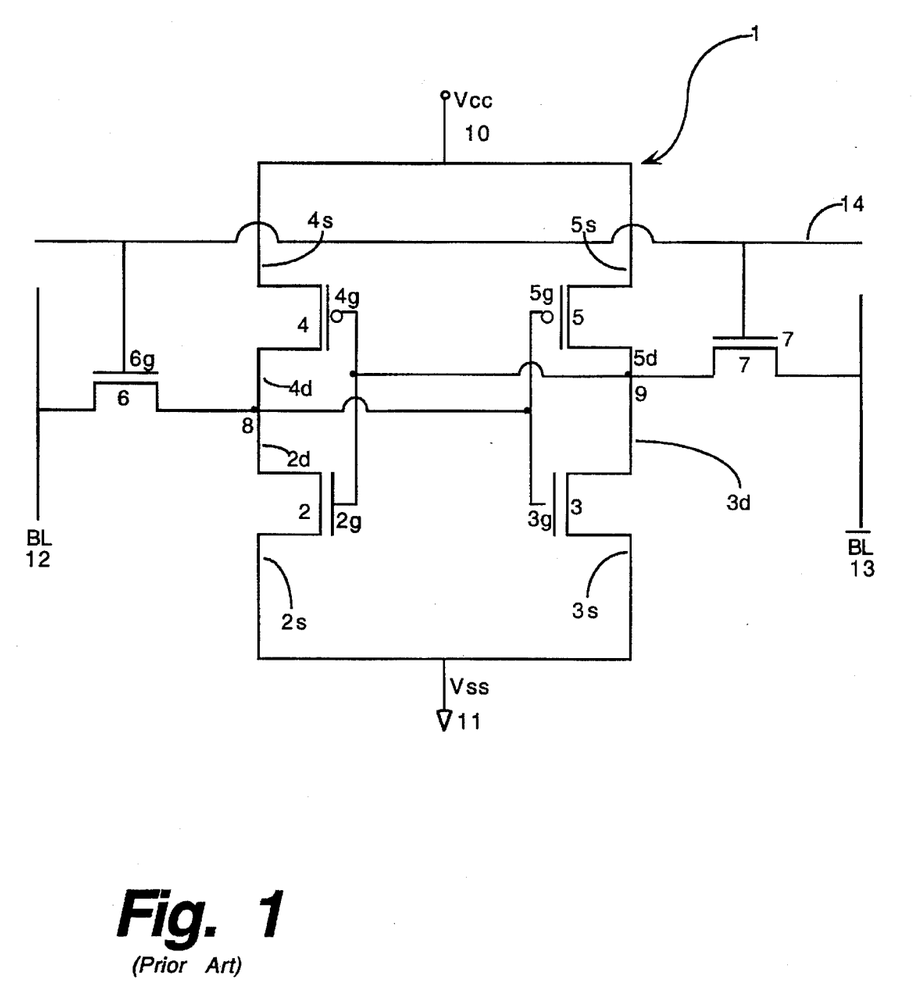
FIG. 1 is a circuit diagram of a conventional six-bulk transistor static memory cell.

A standard static memory cell commonly used in the industry is a six-bulk transistor static memory cell. An example of the conventional six-bulk transistor static memory cell (hereinafter referred to as a "6T cell") is shown in FIG. 1. The 6T cell 1 comprises four latch transistors 2–5 and two access transistors 6–7, each of which having a drain, source and gate. The latch transistors 2–5 include a pair of n-channel pull-down transistors 2 and 3 and a pair of p-channel load transistors 4 and 5, all of which are interconnected so as to form two CMOS inverters coupled in a positive feedback orientation so as to form a memory cell as briefly described above. The pair of n-channel access transistors 6 and 7 are coupled to the 6T cell 1 to allow communication between the cell 1 and an external device through a pair of bitlines 12 and 13. The manner in which the above-indicated transistors are interconnected is set forth below.

With respect to the interconnection of the latch transistors 2–5, a drain of a first pull-down transistor $2d$ is coupled to a drain of a first load transistor $4d$ at a first storage node 8 and a drain of a second pull-down transistor $3d$ is coupled to a drain of a second load transistor $5d$ at a storage source node 9. These nodes 8 and 9 store opposite voltages; namely a logic "1" or "0". Sources of the first and second load transistors $4s$ and $5s$ are coupled to a common power line (hereinafter referred to as a "Vcc line") 10 while sources of the first and second pull-down transistors $2s$ and $3s$ are coupled to a common ground line 11 (hereinafter referred to as a "Vss line"). Gates of the first pull-down and load transistors $2g$ and $4g$ are coupled together and connected to the second storage node 9 and gates of the second pull-down and load transistors $3g$ and $5g$ are coupled together and connected to the first storage node 8.

With respect to the access transistors 6 and 7, each source of the first and second access transistors $6s$ and $7s$ is coupled to the first and second storage nodes 8 and 9, respectively. A drain $6d$ of a first access transistor 6 is coupled to a bitline 12, referred to as BL, which operates as a data line to read data from and write data into the memory cell 1. A drain $7d$ of a second access transistor 7 is similarly coupled to another bitline 13 called $\overline{BL}$. In addition, both gates $6g$ and $7g$ are coupled to a wordline 14 which, in this invention, is laid out perpendicular to the gates of the load and pull-down transistors $2g$–$5g$ but parallel to the Vcc and Vss lines 10 and 11.

The 6T cell 1 is accessed by applying a positive voltage to the wordline 14 so that both of the access transistors 6 and 7 are turned on. This allows one of the two bitlines 12 and 13 to sense the contents of the 6T cell 1 based on the voltage at either the first or second storage nodes 8 and 9.

For example, if storage node 8 is at a high (Vcc) voltage and storage node 9 is at the ground potential (Vss), when the wordline 14 is brought to a high voltage, the pull-down transistor 3 and the second access transistor 7 are both turned on and will thus pull the bitline $\overline{BL}$ 13 down toward the ground potential Vss. Moreover, the first load transistor 4 and the first access transistor 6 are also turned on; thus the bitline BL 12 will be pulled up towards the Vcc potential. Thus the state of the cell 1 ("1" or "0") can be determined by sensing the difference in potential between the bitlines 12 and 13.

Conversely, writing a "1" or a "0" into the cell 1 can be accomplished by forcing the bitline 12 or the bitline 13 to either Vcc or Vss and then raising the wordline 14. The potential placed on either the bitline 12 or the bitline 13 will then be transferred to the storage node 8 or 9, respectively, forcing the cell 1 into either a corresponding "1" state or a "0" state.

The conventional 6T cell 1 offers certain advantages associated with being a CMOS circuit comprising both n-channel and p-channel transistors; namely, the circuit does not experience any current flow from the Vcc line 10 to the Vss line 11 when the 6T cell 1 is simply maintaining stored information due to the use of p-channel devices for the load transistors 4 and 5, as illustrated in FIG. 1. For example, the first n-channel and the first p-channel transistors 2 and 4 are in series between the Vcc and Vss lines 10 and 11. Since these transistors are complementary, e.g. they are activated by opposite polarity signals placed on their respective gates $2g$ and $4g$, the first n-channel pull-down transistor 2 is turned on, the first p-channel load transistor 4 is turned off. The same condition exists for the second pull-down and load transistors 3 and 5. As a result, the memory cell 1 does not experience large power consumption.

Another advantage of the 6T cell is the fact that the p-channel loads are "active" loads; that is, their current-carrying capability varies with the voltage on their gates. This means that, for example, if storage node 8 is high, the gate of the p-channel load transistor 4 is held low by the opposite storage node. Thus, since the voltage between the gate and source (which is tied to the Vcc line) of this transistor 4 is negative, it is turned on into a low-impedance state. Therefore, if the high voltage on storage node 8 is perturbed by random noise, for example, so that it is brought to a potential between Vss and Vcc, the p-channel load transistor 4 can supply enough current to bring the storage node 8 back up to the Vcc potential quickly.

This is especially important for smaller memory cells, which do not have much parasitic capacitance tied to their storage nodes and are therefore more susceptible to data loss due to uncontrollable perturbations. However, the conventional 6T cell 1 is reasonably large in size and thus, is not cost effective in today's competitive semiconductor market.

Figure 2:
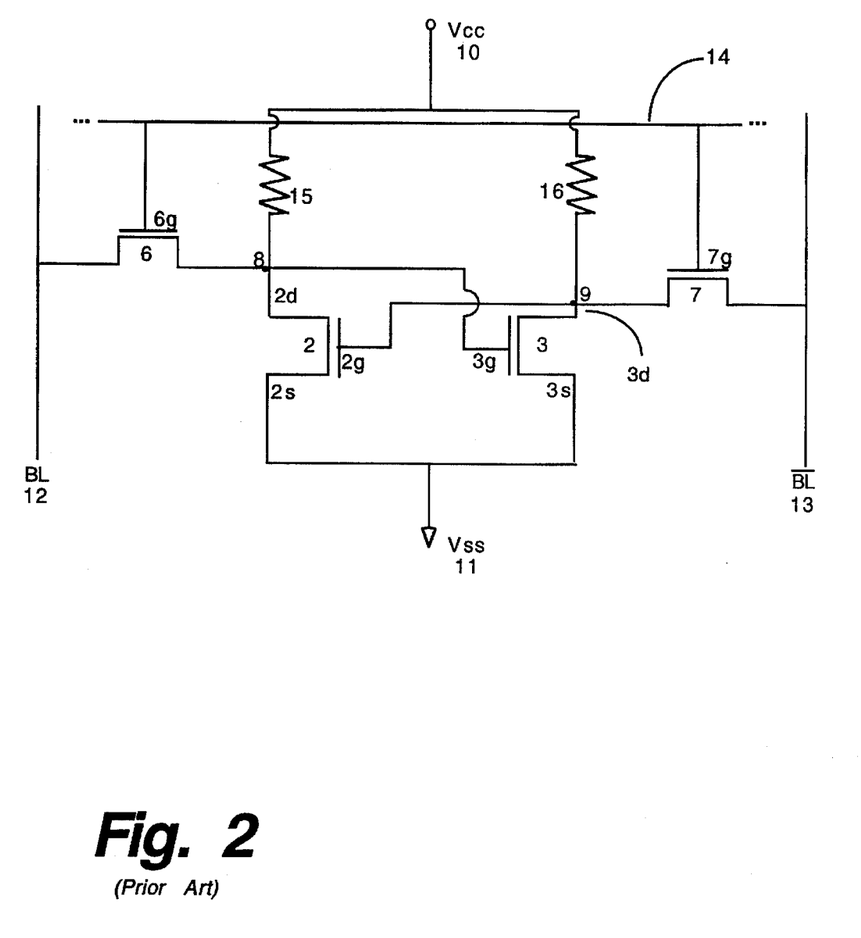
FIG. 2 is a circuit diagram of a conventional four-transistor, two resistor static memory cell.

Commonly, in order to decrease the size of the static memory cells for cost saving reasons, the load transistors 4 and 5 in the 6T cell are substituted with resistors 15 and 16 to produce a 4T-2R cell layout shown in FIG. 2. Since such resistors are capable of being physically folded over the pull-down transistors 2 and 3 by using another layer of material, area usage is maximized. However, in view of the fact that the 4T-2R cell includes resistors 15 and 16 in lieu of load transistors 4 and 5 as shown in FIG. 1, the cell sacrifices the above-mentioned advantages associated with 6T CMOS circuitry.

More specifically, as previously mentioned, when the 6T cell is maintaining stored information, it does not experience any current flow between its Vcc to Vss lines because one transistor (either a load or pull-down transistor) is always off. On the other hand, in the 4T-2R cell, when it is storing information, one of the pull-down transistors is conducting which causes current to flow between the Vcc and Vss lines which implies a high power consumption. In older technology, such current was easily controlled by implementing resistors having a large resistance. The larger memory cells of these older technologies had large parasitic capacitances tied to their storage nodes, so that outside perturbations on a charge stored on the storage nodes (due to impacts by alpha particles, for example) have a small effect on the voltage of the storage node. Thus, a high-current load device was not needed to pull up a perturbed high storage node.

However, as cell sizes have decreased, cell capacitances have also decreased and a load device with higher current capacity is needed for cell stability. Such a device can be obtained by lowering the resistance of a load resistor, but this would increase the power consumption of the cell, eventually to unacceptable levels. The 6T cell design uses active loads to "decouple" power consumption and all stability requirements.

Figure 3:
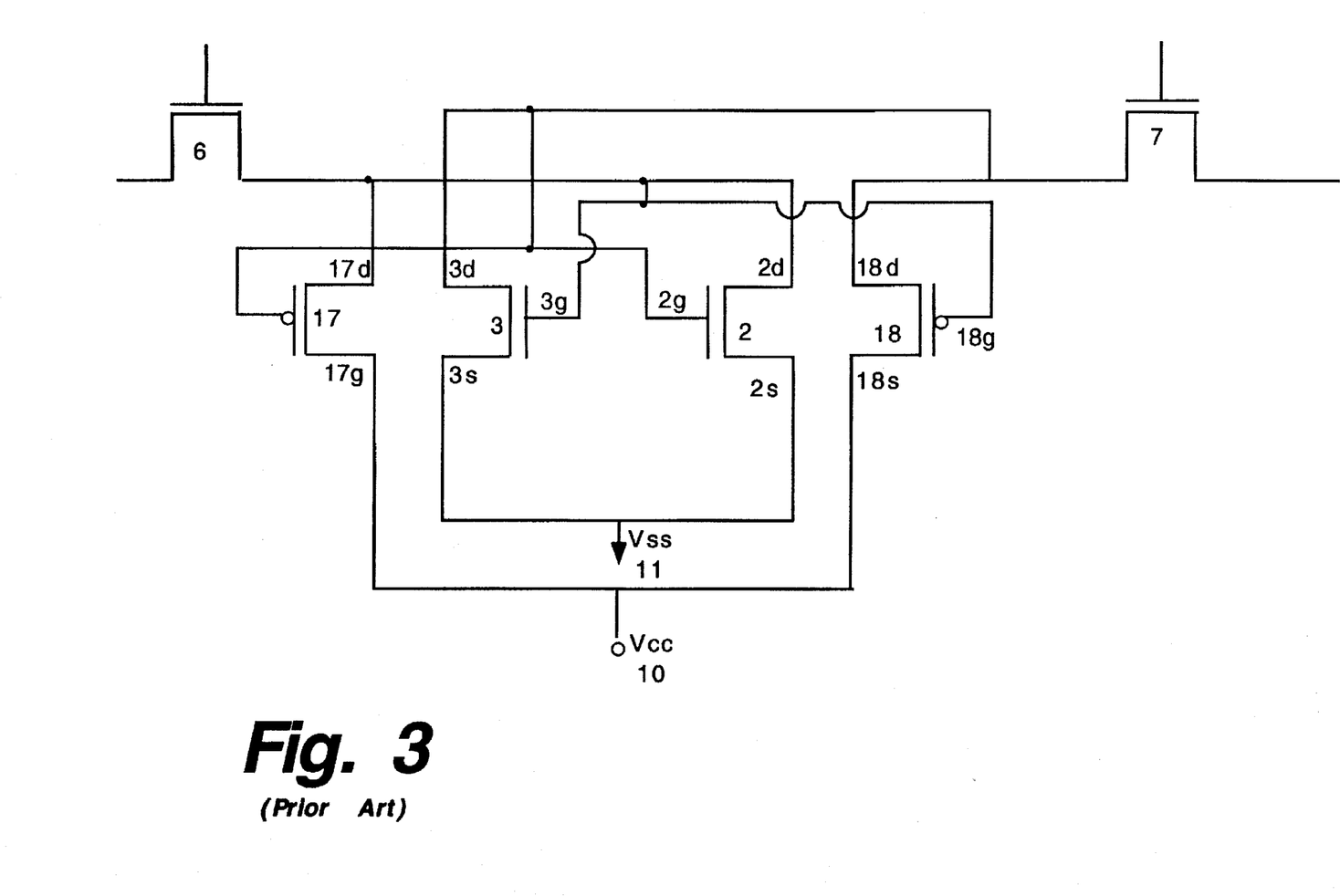
FIG. 3 is a circuit diagram showing a conventional static memory cell substituting a pair of thin film transistors in place of a pair of p-channel load transistors.

In the marketplace, there has been a demand for a static memory cell that provides stability and low power consumption of the 6T cell with the area saving qualities of the 4T-2R cell. As a result, an alternate cell layout had been developed; namely, a circuit substituting polysilicon thin-film transistors 17 and 18 in lieu of the load transistors 4 and 5. The thin-film transistors 17 and 18 are capable of being folded over the lower, bulk silicon transistors 2 and 3 to reduce area usage. Moreover, the circuit has overcomes large power dissipation and cell instability associated with the 4T-2R cell by using transistors in lieu of resistors. However, the disadvantages associated with such fabrication is that the cell requires at least three levels of polysilicon and thus, it quite complex and costly to manufacture.

Hence, it would be desirable to fabricate a 6T cell having a smaller area than conventional 6T cells while providing cell stability and negligible power dissipation.

Based on the foregoing, it can be appreciated that there is a need to provide a stable memory cell which maximizes area usage. Therefore, it is an object of the present invention to provide solid-state bi-stable circuit functioning as a six-bulk transistor static memory cell having each gate of the six transistors positioned in parallel with each other.

Another object of the present invention is to provide a memory cell having a smaller area usage without sacrificing cell stability.

A further object of the present invention is to provide a memory cell having its Vcc and Vss lines to be perpendicular with a plurality of wordlines.

Yet another object of the present invention is to provide a memory cell having its transistors fabricated with a single polysilicon layer.

Another object of the present invention is to provide a memory cell having a substantially square shape for easy packaging.

BRIEF SUMMARY OF THE INVENTION

These and other objects of the present invention are provided by a static memory cell. More specifically, the present invention relates to a solid-state bi-stable circuit functioning as a six-bulk transistor static memory cell, the circuit comprising a plurality of wordlines, a plurality of bitlines, at least one first reference line being a ground line and at least one second reference line being a power line, both of which are oriented perpendicular to the plurality of wordlines, and means for controlling voltage at a first and second storage nodes. The controlling means include a pair of load transistors, each coupled to the at least one power line and the first and the second storage nodes; a pair of pull-down transistors, each coupled to the at least one ground line and the first and second storage nodes; and a first and a second access transistor, wherein the first access transistor is coupled to said first storage node, a first of said plurality of wordlines and a first of said plurality of bitlines, said second access transistor is coupled to the second storage node, a second of said plurality of wordlines and a second of said plurality of bitlines.

BRIEF DESCRIPTION OF THE DRAWINGS

The objects, features and advantages of the present invention will become apparent from the following detailed description of the present invention in which.

DETAILED DESCRIPTION OF THE INVENTION

A device is described for a solid-state bi-stable circuit functioning as a six-bulk transistor static memory cell efficiently maximizing area usage. In the following detailed description, numerous specific details are set forth, such as specific interconnections. It is apparent, however, to one skilled in the art that the present invention may be practiced without incorporating specific components. It should be borne in mind that the present invention need not be limited for use in connection with static memory, but may find wide application for many other memory devices.

As previously discussed herein, FIGS. 1–3 illustrate prior memory cell designs; namely, the conventional 6T cell, the 4T-2R cell and the Thin-Film Transistor cell respectively.

Figure 4:
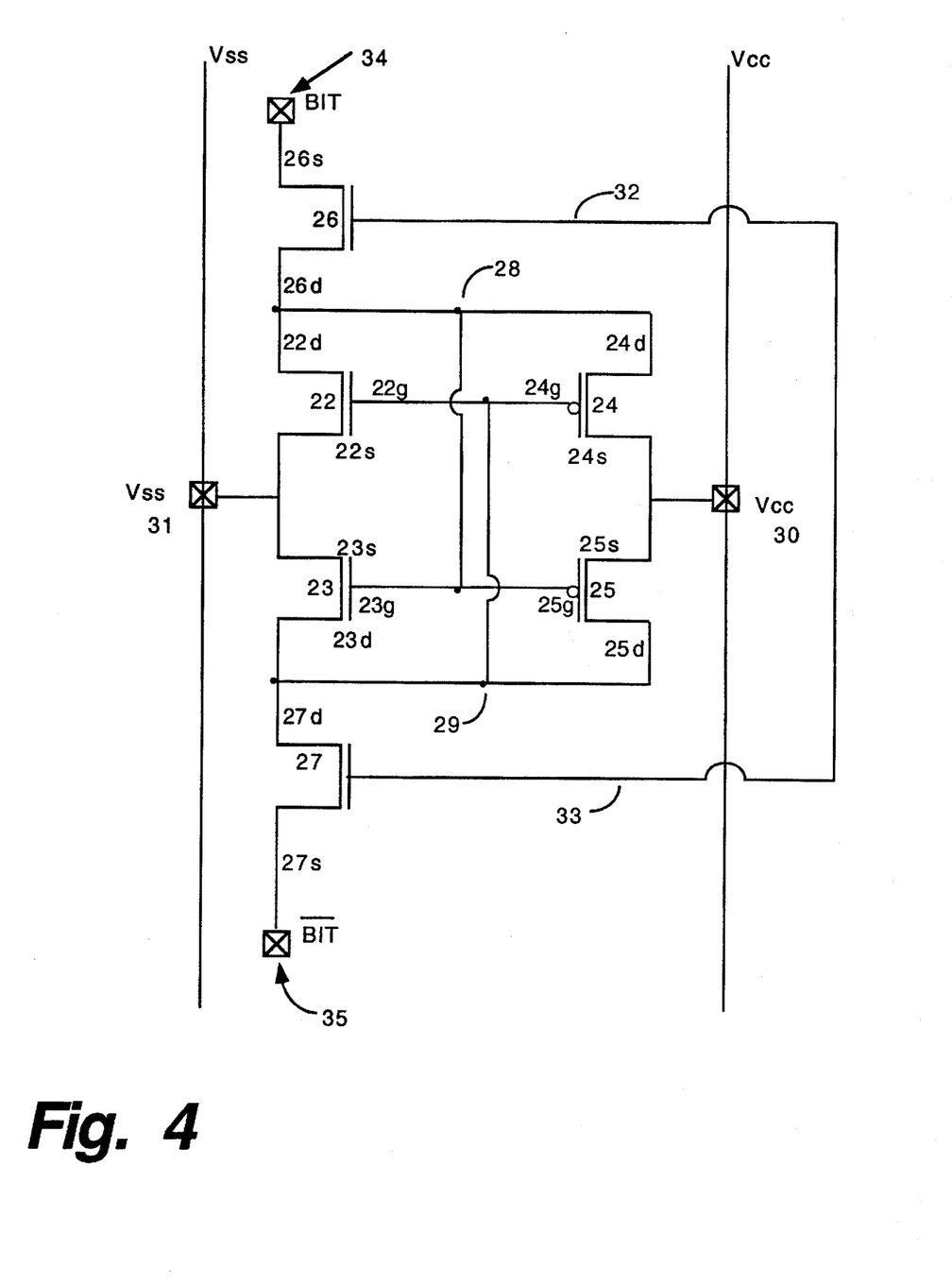
FIG. 4 is a circuit diagram of the present invention.

Referring now to FIG. 4, the present invention relates to a CMOS 6T Split Wordline cell 21. The 6T Split Wordline cell 21 has four latch transistors 22–25, implemented as MOS insulated gate field effect transistors, including a first and second n-channel pull-down transistors 22 and 23 sharing a common source, namely a Vss line 31 which is a reference voltage line and a first and second p-channel load transistors 24 and 25, both of which are coupled to a Vcc line 30. The drains of the first pull-down and load transistors 22d and 24d are coupled together at a first storage node 28 while the gates of the first pull-down and load transistors 22g and 24g are coupled together and connected to a second storage node 29. These gates 22g and 24g run parallel with a plurality of wordlines 32 and 33. FIG. 4 shows wordlines 32 and 33 coupled together, externally to the cell 21, not internally with respect to the cell 21.

The drains of the second pull-down and load transistors 23d and 25d are coupled together in a manner similar to the first pull-down and load transistors 22 and 24. The gates of the second pull-down and load transistors 23g and 25g, however, are coupled together and connected to the first storage node 28. These gates 23g and 25g run parallel to the gates 22g and 24g as well as with the plurality of wordlines 32 and 33.

With respect to the access transistors 26 and 27, each drain of the first and second access transistors 26d and 27d is coupled to the first and second storage nodes 28 and 29, respectively. A gate 26g of the first access transistor 26 is coupled to a first wordline 32. Its source 26s is coupled to a bitline, namely BIT 34, which operates as a data line to read and/or write data into the cell 21 when the access transistor 26 is activated by the first word line 32. Similarly, a source 27s of a second access transistor 27 is coupled to another bitline 35 called $\overline{BIT}$. In addition, gate 27g is coupled to a second wordline 33 wherein both of the wordlines run parallel to the gates of the load and pull-down transistors 22g–25g but perpendicular to the Vcc and Vss lines 30 and 31. These wordlines 32 and 33 are connected together external from the cell 21 so that both wordlines rise and fall in potential together. It will be appreciated that these wordlines may be implemented as polysilicon lines deposited above the substrate. In this way, connections from the cell 21 to both bitlines are established simultaneously so that the difference between the potentials of the bitlines BIT and $\overline{BIT}$ can be sensed in order to read the state of the cell 21, rather than the potential of only one of these lines with respect to the ground potential. This allows a larger voltage signal to be sensed and thus lessens the chance of error in sensing.

In comparing the conventional 6T cell 1 in FIG. 1 with the 6T Split Wordline cell 21 in FIG. 4, there are many design differences between the two. The first difference is that the present invention incorporates a plurality of wordlines 32 and 33 used to activate the pair of access transistors 26 and 27 in lieu of a single word line. An additional wordline 33 is due to the specific orientation of the six transistors 22–27. The second major difference is that the pull-up and load transistors 22–25 are rotated with respect to the plurality of wordlines 32 and 33 such that the gates of these transistors 22g–25g are not only parallel to each other, but they are parallel to the plurality of wordlines 32 and 33. Both of these differences can be seen by comparing FIG. 7 with FIG. 6. Such positioning enables the present invention to be packed more densely than the conventional 6T cell in FIG. 1 and realigns the Vcc and Vss lines 30 and 31 to be perpendicular with respect to the plurality of wordlines 32 and 33 as shown in FIG. 5b and FIG. 7.

Figure 5A:
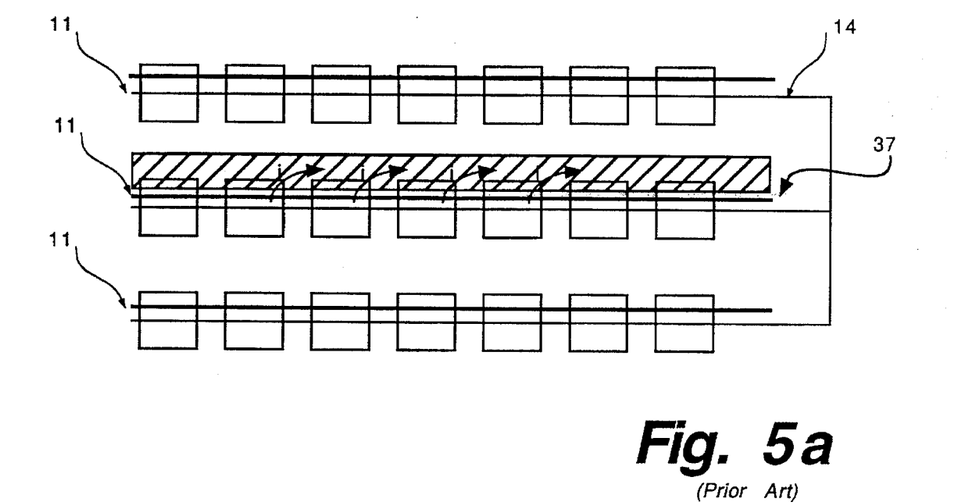
FIG. 5a is an illustration of an array of static memory cells shown in FIG. 1 in combination with Vss and Vcc lines running parallel to a wordline.
Figure 5B:
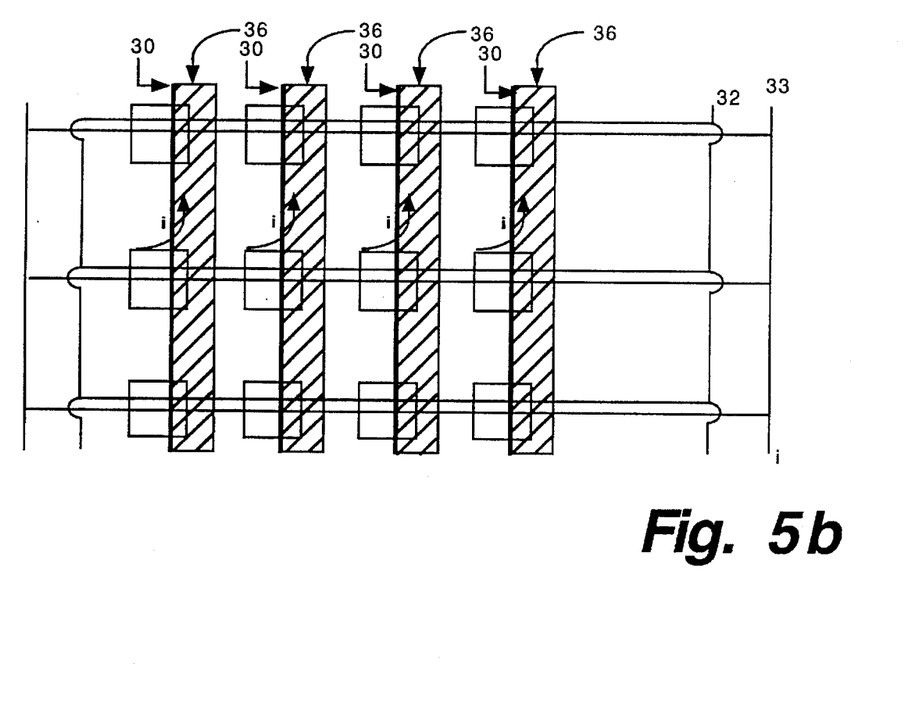
FIG. 5b is an illustration of an array of static memory cells shown in FIG. 5 in combination with Vss and Vcc lines running perpendicular to a wordline.

As shown in FIG. 5b, the realignment of the Vcc and Vss lines 30 and 31 to be perpendicular to the plurality of wordlines 32 and 33 allows when a row of cells is accessed by activating a wordline, current drawn from the bitlines 34 and 35 (not shown) through the cells to Vss is distributed among many perpendicular Vss lines rather than through a single parallel Vss line 11 as is done for conventional memory cells as shown in FIG. 5a. Thus, the 6T split wordline cell 21 is more stable because less current flows through either the Vcc line 30 or Vss line 31 (not shown) resulting in a lesser voltage drop across these lines. As a result, the voltage of the cell 21 is closer to true Vss or true Vcc thereby creating a wider voltage swing across the cell 21 and thus, making it more difficult for the cell 21 to flip between the two voltages. Therefore, the Vss line 31 can be made from a less conductive material without increasing the strapping frequency to a metal Vss line. Also, the width of these Vss lines will not be limited by any electromigration effects.

Another advantage is that in the present invention, the p-wells 36 (for the n-channel pull-down transistors, such as FETs 22 and 23) would be laid out perpendicular to the plurality of wordlines 32 and 33, as shown in FIG. 5b. Such p-wells 36 differ from the p-wells 37 oriented parallel to the wordline 14 found in the conventional 6T cells shown in FIG. 5a. The fewer cell transistors turned on per well, less substrate current "i" will be generated. As a result, less substrate contacts have to be used, compared to the typical layout architecture. This means that the effective cell size (cell size and area for substrate contacts) can be smaller in the new architecture.

Figure 6:
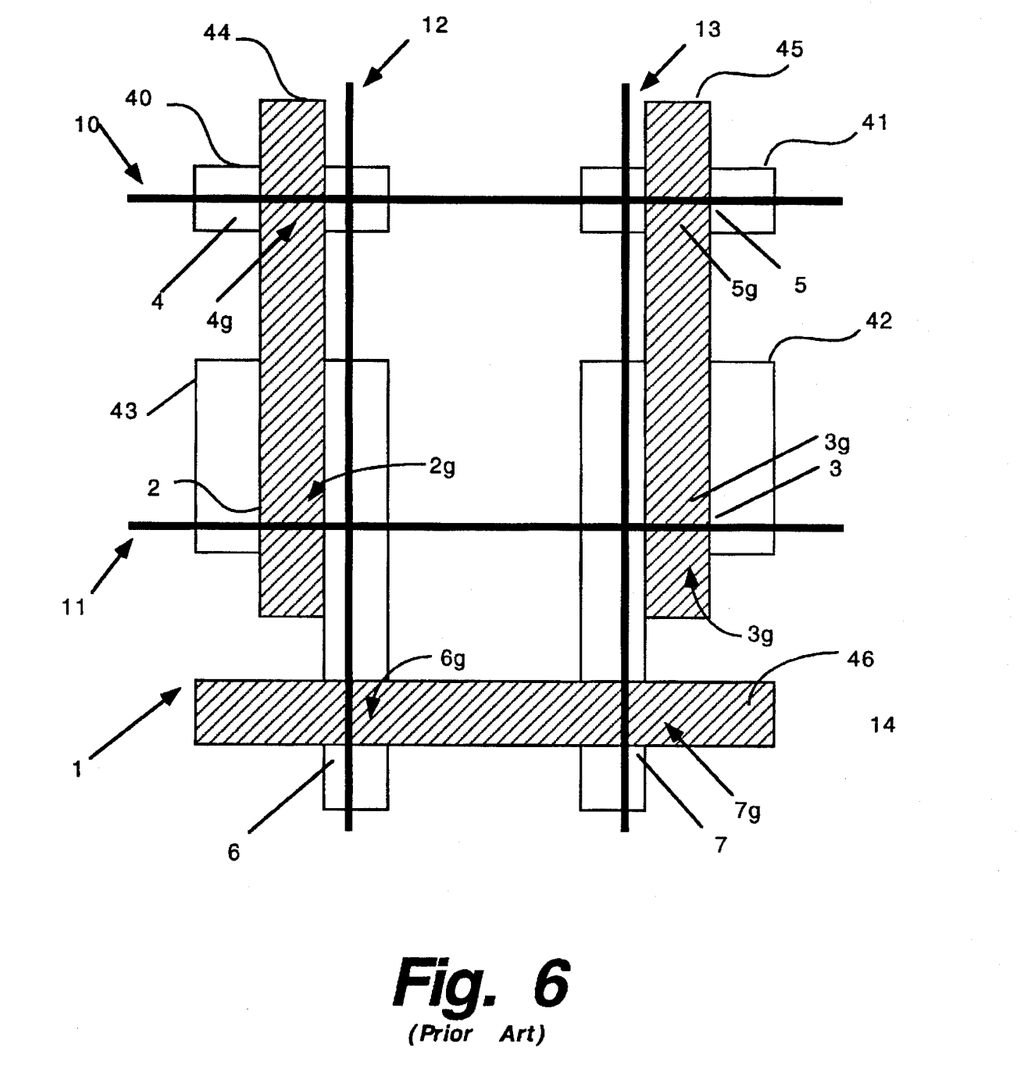
FIG. 6 is an layout perspective of the conventional six-bulk transistor static memory cell as shown in FIG. 1.
Figure 7:
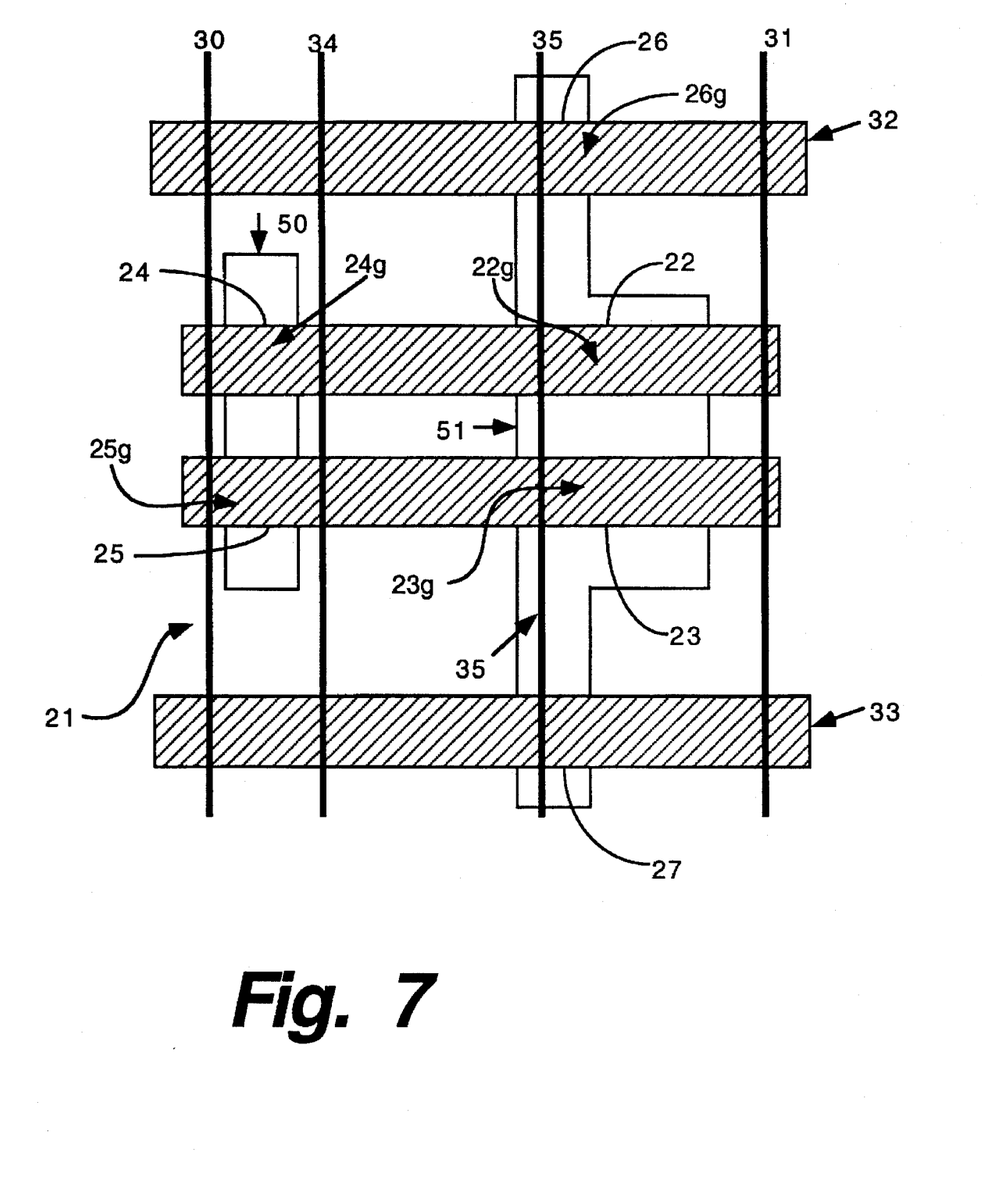
FIG. 7 is an layout perspective of the six-bulk transistor static memory cell of the invention as shown in FIG. 4.

Referring to FIG. 6, it shows an etched layout perspective view of the conventional six-bulk transistor static memory cell 1 as shown in FIG. 1. The clear rectangular boxes 40–43 represent the active layer which, in turn, represents the source and drain of the transistors 2s–7s and 2d–7d. More specifically, a first and second boxes 40 and 41 represent the source and drain of the first and second load transistors 4 and 5, while a third and fourth box 42 and 43 illustrate the source and drain of the pull-down and access transistors 2–3 and 6–7.

Shown as rectangles with diagonal shading 44–46, the gate layer is made of a polysilicon material and is deposited on the active layer to form the load, pull-down and access transistors 2–7. The gate layer is deposited so that the wordline 14 forming the gates of the access transistors 6g and 7g is perpendicular to the gates of the load and pull-down transistors 2g–5g. A third layer 47, usually a metal layer, is deposited on the gate layer to act as external connections to the cell 1. For example, the Vcc and Vss lines 10 and 11 partially form the third layer. The third layer are shown as solid, thick black lines.

FIG. 7 shows an etched layout perspective of the present invention according to FIG. 4. In FIG. 7, the clear rectangular boxes 50 and 51 also represent the active layer forming the source and drain portion of transistor pairs 22–27. A first rectangular portion 50 of the active layer represents the positioning of the source and drain of the load transistors 24 and 25. A second rectangular portion 51 represents the source and drain of the pull-down and access transistors 22–23 and 26–27.

The gate layer in FIG. 7 is represented by four rectangles with diagonal shading 52–55, wherein the outer rectangles depict the wordlines 32 and 33 (i.e., gates of the access transistors 26 and 27), while the inner rectangles depict the gate layer of the pull-down and load transistors 22g–25g pairs. Such positioning causes the gates of the pull-down and load transistors 22g–25g to be parallel with the wordlines 32 and 33, thereby further causing the Vcc and Vss lines 30 and 31 as well as the data bitlines 34 and 35 to run perpendicular to the wordlines 32 and 33. Therefore, in addition to those advantages as described above, the memory cell 21 also undergoes a square form which is advantageous for packaging decreasing a height of the 6T split-wordline cell 21. Moreover, simplifying the layout of the cell 21 has an effect of lessening the cell's height to be approximately 20% less than a height of the conventional 6T cell.

The present invention described herein may be designed in many different materials and using many different components. While the present invention has been described in terms of various embodiments, other embodiments may come to mind to those skilled in the art without departing from the spirit and scope of the present invention. The invention should, therefore, be measured in terms of the claims which follow.

What we claim is:

1. A memory cell comprising:
   a plurality of active regions formed in a semiconductor substrate, said plurality of active regions being arranged substantially in parallel with one another;
   a split wordline comprising first and second wordline strips manufactured of a first material and arranged substantially in parallel with one another, wherein said first and second wordline strips are coupled together outside of said memory cell so that said first and second wordline strips rise and fall in potential together, said first and second wordline strips further being arranged substantially perpendicular to said active regions, said first wordline strip being coupled to a gate of a first transistor and said second wordline strip being coupled to a gate of a second transistor;
   a plurality of gain strips manufactured of a second material and arranged substantially in parallel with one another and with said first and second wordline strips, said gate strips further being arranged substantially perpendicular to said active regions to form a bi-stable memory circuit having a first storage node and a second storage node.

2. The memory cell according to claim 1, further comprising at least one first reference line, at least one second reference line and a plurality of bitlines, each of the at least one first and at least one second reference lines and the bitlines being oriented perpendicular to said first and second wordline strips, wherein said bi-stable memory circuit includes:
   a first and a second load transistor, each coupled to the second reference line and to the first and second storage nodes;
   a first and a second pull-down transistor, each coupled to the first reference line and the first and second storage nodes, and wherein said first and second transistors comprise:
      a first and a second access transistor, said first access transistor coupled to said first storage node and a first of said plurality of bitlines, said second access transistor coupled to said second storage node and a second of said plurality of bitlines.

3. The memory cell according to claim 2, wherein said first and second load transistors are p-channel field effect transistors.

4. The memory cell according to claim 3, wherein a source of said first load transistor and a source of said second load transistor are both coupled to the at least one second reference line, a drain and a gate of said first load transistor are coupled to said first and second storage node respectively, while a drain and a gate of said second load transistor are coupled to said second and first storage node respectively.

5. The memory cell according to claim 2, wherein said first and second pull-down transistors are n-channel field effect transistors.

6. The memory cell according to claim 5, wherein a source of said first pull-down transistor and a source of said second pull-down transistor are both coupled to the at least one first reference line, a drain and a gate of said first pull-down transistor are coupled to the first storage node and the second storage node respectively, while a drain and a gate of said second pull-down transistor are coupled to the second and first storage nodes respectively.

7. The memory cell according to claim 2, wherein said first and second access transistors are n-channel field effect transistors.

8. A memory cell comprising:
   a plurality of active regions formed in a semiconductor substrate, said plurality of active regions being arranged substantially in parallel with one another;
   a split wordline comprising first and second wordline strips manufactured of a first material and arranged substantially in parallel with one another, wherein said first and second wordline strips are coupled together outside of said memory cell so that said first and second wordline strips rise and fall in potential together, said first and second wordline strips further being arranged substantially perpendicular to said active regions, said first wordline strip being coupled to a gate of a first transistor and said second wordline strip being coupled to a gate of a second transistor;
   a plurality of bitlines;
   at least one first reference line;
   at least one second reference line;
   a plurality of gate strips manufactured of a second material and arranged substantially in parallel with one another and said first and second wordline strips, said gate strips further being arranged substantially perpendicular to said active regions to form a plurality of transistors.

9. The memory cell according to claim 8, wherein said plurality of transistors in said memory cell include:
   a first and a second load transistor, each of said load transistors coupled to the at least one second reference line and to a first storage node and to a second storage node;
   a first and a second pull-down transistor, each of said pull-down transistors coupled to the at least one first reference line and to the first and second storage nodes.

10. The memory cell according to claim 9, wherein said first and second load transistors are p-channel field effect transistors and wherein said first transistor comprises a first access transistor and said second transistor comprises a second access transistor, said first access transistor coupled to said first storage node and a first of said bitlines, said second access transistor coupled to said second storage node and a second of said plurality of bitlines.

11. The memory cell according to claim 9, wherein a source of said first load transistor and a source of said second load transistor are both coupled to the at least one second reference line, a drain and a gate of said first load transistor are coupled to said first and second storage node respectively, while a drain and a gate of said second load transistor are coupled to said second and first storage node respectively.

12. The memory cell according to claim 9, wherein said first and second pull down transistors are n-channel field effect transistors.

13. The memory cell according to claim 9, wherein a source of said first pull-down transistor and a source of said second pull-down transistor are both coupled to the at least one first reference line, a drain and a gate of said first pull-down transistor are coupled to the first storage node and the second storage node respectively, while a drain and a gate of said second pull-down transistor are coupled to the second and first storage nodes respectively.

14. The memory cell according to claim 10, wherein said first and second access transistors are n-channel field effect transistors.

15. A semiconductor memory cell comprising:
- a plurality of active regions formed in a semiconductor substrate, said plurality of active regions being arranged substantially in parallel with one another,
- a split wordline comprising first and second wordline strips arranged substantially in parallel with one another, wherein said first and second wordline strips are coupled together outside of said memory cell so that said first and second wordline strips rise and fall in potential together, said first wordline strip being coupled to a gate of a first transistor and said second wordline strip being coupled to a gate of a second transistor;
- at least one first reference line;
- at least one second reference line;
- a plurality of gain strips substantially in parallel with one another, the plurality of gate strips being arranged relative to the plurality of active regions to form a plurality of transistors.

16. The semiconductor memory cell according to claim 15, wherein said plurality of transistors in said memory cell include:
- a first and a second load transistor, each coupled to the at least one second reference line and to a first storage node and to a second storage node;
- a first and a second pull-down transistor, each coupled to the at least one first reference line and to the first and second storage nodes.

17. A semiconductor memory cell as in claim 15, wherein said at least one first reference line and said at least one second reference line are arranged substantially perpendicular to said first and second wordline strips.

* * * * *

UNITED STATES PATENT AND TRADEMARK OFFICE
CERTIFICATE OF CORRECTION

| | | |
|---|---|---|
| PATENT NO. | : | 5,654,915 |
| DATED | : | August 5, 1997 |
| INVENTOR(S) | : | Stolmeijer et al. |

It is certified that error appears in the above-identified patent and that said Letters Patent is hereby corrected as shown below:

In column 7 at line 39 delete "gain" and insert --gate--

In column 10 at line 9 delete "gain" and insert --gate--

Signed and Sealed this

Twenty-third Day of December, 1997

Attest:

BRUCE LEHMAN

*Attesting Officer*   *Commissioner of Patents and Trademarks*